(12) United States Patent
Nishimura

(10) Patent No.: US 10,134,828 B2
(45) Date of Patent: Nov. 20, 2018

(54) DISPLAY DEVICE AND METHOD OF MANUFACTURING A DISPLAY DEVICE

(71) Applicant: Japan Display Inc., Minato-ku (JP)

(72) Inventor: Masumi Nishimura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/784,270

(22) Filed: Oct. 16, 2017

(65) Prior Publication Data

US 2018/0108723 A1    Apr. 19, 2018

(30) Foreign Application Priority Data

Oct. 18, 2016    (JP) ................. 2016-204545

(51) Int. Cl.
| | |
|---|---|
| H01L 27/15 | (2006.01) |
| H01L 27/32 | (2006.01) |
| H01L 27/12 | (2006.01) |
| H01L 51/52 | (2006.01) |
| H01L 51/00 | (2006.01) |

(52) U.S. Cl.
CPC ...... *H01L 27/3276* (2013.01); *H01L 27/1218* (2013.01); *H01L 27/1244* (2013.01); *H01L 51/0097* (2013.01); *H01L 51/5253* (2013.01); *H01L 2227/323* (2013.01)

(58) Field of Classification Search
CPC ............ H01L 27/1218; H01L 27/1244; H01L 27/3276; H01L 51/0097
See application file for complete search history.

(56) References Cited

FOREIGN PATENT DOCUMENTS

JP    2016-031499    3/2016

*Primary Examiner* — Julio J Maldonado
*Assistant Examiner* — Molly Reida
(74) *Attorney, Agent, or Firm* — Oblon, McClelland, Maier & Neustadt, L.L.P.

(57) ABSTRACT

A display device according to an embodiment of the present invention includes: a base material including a display region, and a peripheral region which is located outside the display region, at least a part of the peripheral region being a bending region; an insulating layer that is disposed on the base material, extends from the display region to a part of the peripheral region, and is located apart from an edge of the base material; at least one level difference moderating layer that is disposed under the insulating layer and extends from an edge of the insulating layer toward a side of the bending region; and at least one wiring disposed on the insulating layer and the at least one level difference moderating layer.

10 Claims, 7 Drawing Sheets

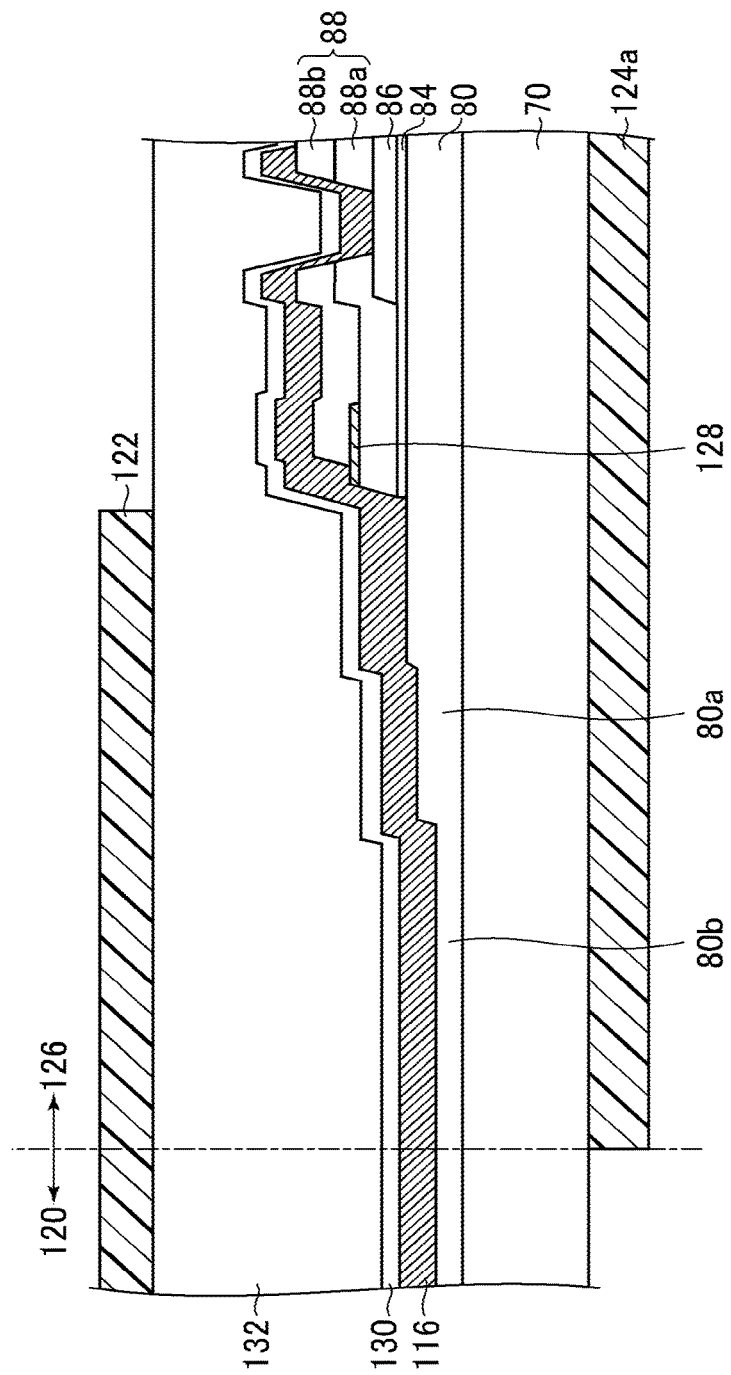

DISPLAY DEVICE AND METHOD OF MANUFACTURING A DISPLAY DEVICE

CROSS-REFERENCE TO RELATED APPLICATION

The present application claims priority from Japanese Application JP2016-204545 filed on Oct. 18, 2016, the content of which is hereby incorporated by reference into this application.

BACKGROUND OF THE INVENTION

1. Field of the Invention

One or more embodiments of the present invention relate to a display device and a method of manufacturing a display device.

2. Description of the Related Art

As to a display device provided with a display region, such as an organic electroluminescence (EL) display device and a liquid crystal display device, in recent years, a development of a flexible display whose display panel can be bent by using a base material having flexibility is proceeded.

For example, as disclosed in Japanese Patent Application Laid-Open No. 2016-031499, is suggested to bend mounting portion of an integrated circuit (IC) and a flexible printed circuit (FPC) toward a backside of a display region, to thereby narrow down a frame.

SUMMARY OF THE INVENTION

For example, on a display panel, a wiring is laminated on a base material. However, near the bending region of the above display panel, a disconnection of a wire may occur.

The purpose of an embodiment of the present invention is, in consideration of the above, to provide a display device in which a disconnection of a wire that occurs near the bending region is suppressed, and a manufacturing method thereof.

A display device according to an embodiment of the present invention includes: a base material including a display region, and a peripheral region which is located outside the display region, at least a part of the peripheral region being a bending region; an insulating layer that is disposed on the base material, extends from the display region to a part of the peripheral region, and is located apart from an edge of the base material; at least one level difference moderating layer that is disposed under the insulating layer and extends from an edge of the insulating layer toward a side of the bending region; and at least one wiring disposed on the insulating layer and the at least one level difference moderating layer.

In one embodiment of the present invention, the at least one level difference moderating layer is disposed along the at least one wiring.

In one embodiment of the present invention, the at least one level difference moderating layer includes a semiconductor material and/or metal.

In one embodiment of the present invention, the insulating layer includes an inorganic insulating material.

In one embodiment of the present invention, the display device further includes: an underlayer that comprises an inorganic insulating material and is disposed on the base material, under the insulating layer, and under the at least one level difference moderating layer.

In one embodiment of the present invention, the underlayer has a first portion with a first thickness and a second portion with a second thickness, the first portion overlaps the at least one level difference moderating layer and contacts the second portion directly, the second portion does not overlap the at least one level difference moderating layer, and the second thickness is smaller than the first thickness.

In one embodiment of the present invention, the insulating layer has a lamination structure including a first insulating layer and a second insulating layer, and the at least one level difference moderating layer extends from an edge (edges) of the first insulating layer and/or the second insulating layer toward a side of the bending region.

In one embodiment of the present invention, the at least one wiring includes a plurality of wirings, the plurality of wirings being separated from one another, the at least one level difference moderating layer includes a plurality of level difference moderating layers, the plurality of level difference moderating layers being separated from one another, and each of the plurality of level difference moderating layers is positioned under each of the plurality of wirings.

According to another aspect of the present invention, a manufacturing method of a display device is provided. The manufacturing method of a display device includes: forming a level difference moderating layer, on a portion of a base material including a display region and a peripheral region which is located outside the display region, at least a part of the peripheral region being a bending region, and the portion being included in the peripheral region and being separated from the display region; forming an insulating layer covering the level difference moderating layer; patterning the insulating layer by etching, and forming a patterned insulating layer which covers only an edge part of the level difference moderating layer, the edge part being located at side of the display region; and forming a wiring on the patterned insulating layer and the level difference moderating layer. The level difference moderating layer is formed of a material an etching rate of which is lower than that of the insulating layer.

In one embodiment of the present invention, an underlayer is formed on the base material in advance before forming the level difference moderating layer, and when performing the etching the underlayer is also etched.

BRIEF DESCRIPTION OF THE DRAWINGS

FIG. 7 is a diagram to illustrate a variation of the present embodiment.

DETAILED DESCRIPTION OF THE INVENTION

Figure 1:
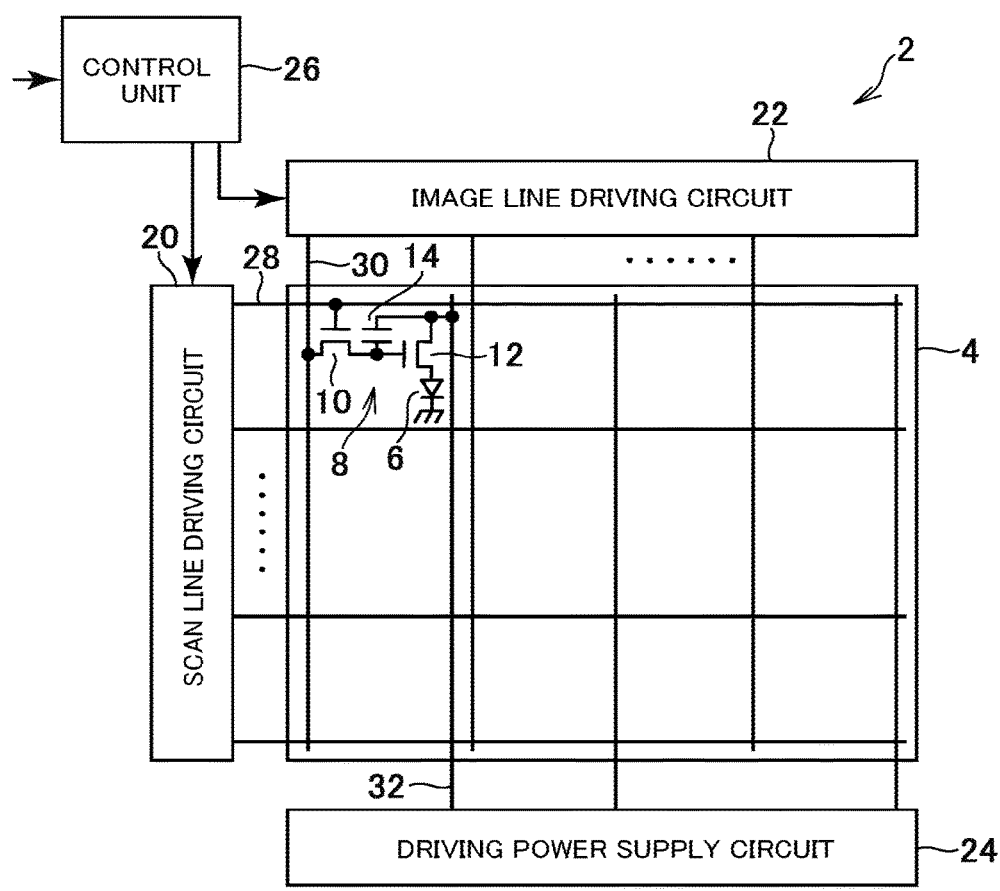
FIG. 1 is a schematic diagram that illustrates a schematic configuration of an organic EL display device according to an embodiment of the present invention.

Below, respective embodiments of the present invention are explained with reference to the accompanying drawings. Note that disclosed embodiments are merely examples, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

FIG. 1 is a schematic diagram that illustrates a schematic configuration of a display device according to an embodiment of the present invention, choosing an organic EL display device as an example. An organic EL display device 2 is provided with a pixel array part 4 to display an image, and a driving part that drives the pixel array part 4. The organic EL display device 2 is a flexible display using a resin film as a base material, and a lamination structure such as a TFT and an OLED is formed on this base material constituted by the resin film. Note that the schematic diagram illustrated in FIG. 1 is an example, and the present embodiment is not limited thereto.

On the pixel array part 4, an OLED 6 and a pixel circuit 8 are arranged in a matrix, in correspondence with a pixel. The pixel circuit 8 is constituted by a plurality of TFTs 10 and 12, and a capacitor 14.

The above driving part includes a scan line driving circuit 20, an image line driving circuit 22, a driving power supply circuit 24, and a control unit 26, and drives the pixel circuit 8 to control light emission of the OLED 6.

The scan line driving circuit 20 is connected to a scan signal line 28 provided for each array of pixels arranged in the horizontal direction (each pixel row). The scan line driving circuit 20 chooses scan signal lines 28 in order, in response to timing signals input from the control unit 26, and applies electric voltages for turning on a lighting TFT 10 to the chosen scan signal lines 28.

The image line driving circuit 22 is connected to an image signal line 30 provided for each array of pixels arranged in the vertical direction (each pixel column). To the image line driving circuit 22 an image signal is input from the control unit 26, and, in accordance with a selection of the scan signal line 28 by the scan line driving circuit 20, the image line driving circuit 22 outputs an electric voltage in accordance with the image signal of the chosen pixel row to each image signal line 30. The electric voltage is written into the capacitor 14 via the lighting TFT 10 in the chosen pixel row. The driving TFT 12 supplies the OLED 6 an electric current in accordance with the voltage written thereinto, and by this, the OLED 6 of a pixel corresponding to the chosen scan signal line 28 emits light.

The driving power supply circuit 24 is connected to a driving power supply line 32 provided for each pixel column, and supplies an electric current to the OLED 6 via the driving power supply line 32 and the driving TFT 12 of the chosen pixel row.

Here, a lower electrode of the OLED 6 is connected to the driving TFT 12. Meanwhile, an upper electrode of each OLED 6 is constituted by an electrode shared by the OLEDs 6 of all the pixels. In a case where the lower electrode is configured as an anode, a high electric potential is input thereto, and the upper electrode becomes a cathode and a low electric potential is input thereto. In a case where the lower electrode is configured as the cathode, a low electric potential is input thereto, and the upper electrode becomes the anode and a high electric potential is input thereto.

Figure 2:
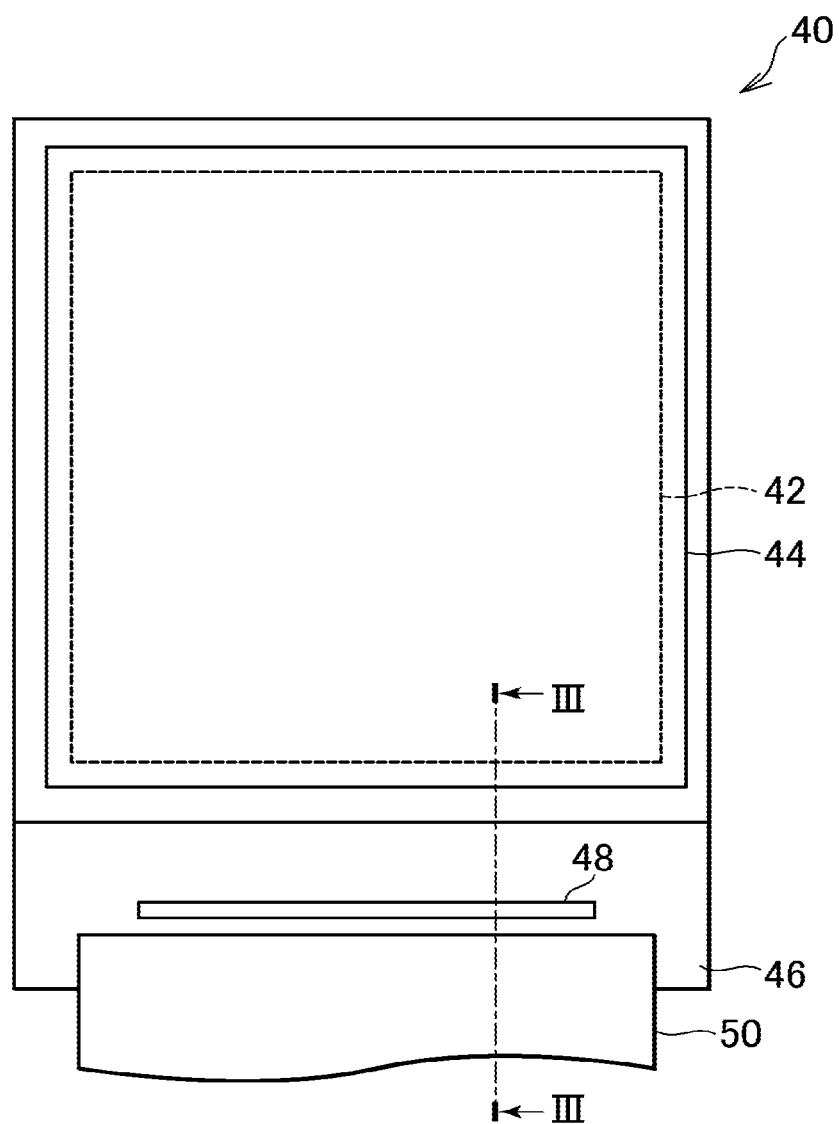
FIG. 2 is a schematic planar diagram that illustrates an example of a display panel of the organic EL display device illustrated in FIG. 1.

FIG. 2 is a schematic planar diagram that illustrates an example of the display panel of the organic EL display device illustrated in FIG. 1. In a display region 42 of a display panel 40, the pixel array part 4 illustrated in FIG. 1 is provided, and as described above OLEDs are arranged in the pixel array part 4. As described above, the upper electrode 44 that constitutes the OLED 6 is formed to be commonly shared by the respective pixels, and covers all of the display region 42.

On one side of the display panel 40 in a rectangular shape a component mounting region 46 is provided, and a wiring connected to the display region 42 is disposed. On the component mounting region 46 a driver IC 48 that constitutes the driving part is mounted, and to the component mounting region 46 an FPC 50 is connected. The FPC 50 is connected to the control unit 26 and other circuits 20, 22, 24 and the like, and an IC is mounted on the FPC 50.

Figure 3:
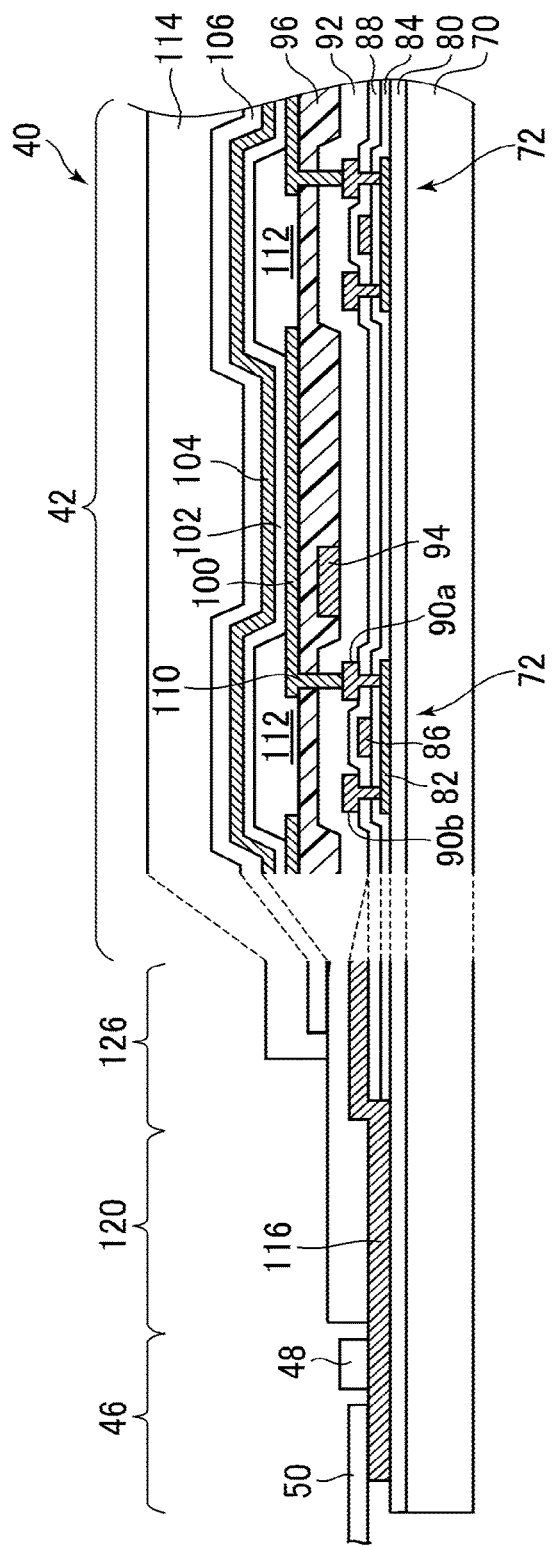
FIG. 3 is a diagram that illustrates an example of III-III cross section of FIG. 2.

FIG. 3 is a diagram that illustrates an example of III-III cross section of FIG. 2. The display panel 40 has a structure where circuit layers composed of TFT 72 and the like, the OLED 6, and a sealing layer 106 that seals the OLED 6, and the like are laminated on the base material 70 constituted by a resin film. As the resin film constituting the base material 70, for example, a polyimide resin film is used. On the sealing layer 106, a protection film 114 is formed. In the present embodiment, the pixel array part 4 is of the top emission type, and the light generated in the OLED 6 is emitted toward the side opposite to the base material 70 side (upward in FIG. 3). Note that in a case where the colorization method of the organic EL display device 2 is determined to be the color filter method, for example, a color filter is disposed between the sealing layer 106 and the protection film 114, or on an opposite substrate side of the display panel 40. By letting white light generated in the OLED 6 go through this color filter, lights in red (R), green (G), and blue (B), for example, are generated.

In the circuit layers of the display region 42, the pixel circuit 8 described above, the scan signal line 28, the image signal line 30, the driving power supply line 32, and the like mentioned above are formed. At least a part of the driving part can be formed on the base material 70 as the circuit layers, in a region adjacent to the display region 42, specifically, a peripheral region located outside the display region 42. As described above, the driver IC 48 and the FPC 50 that constitute the driving part can be, in the component mounting region 46, connected to the wiring 116 of the circuit layers.

As illustrated in FIG. 3, on the base material 70, an underlayer 80 formed of an inorganic insulating material is disposed. As the inorganic insulating material, for example, silicon nitride ($SiN_y$), silicon oxide ($SiO_x$), and a composite of these are used.

In the display region 42, a semiconductor region 82 that becomes a channel part and source/drain parts of the TFT 72 of the top gate type is formed on the base material 70 with an interposition of the underlayer 80. The semiconductor region 82 is formed of, for example, polysilicon (p-Si). The semiconductor region 82 is formed by, for example, providing a semiconductor layer (a p-Si film) over the base material 70, patterning this semiconductor layer, and selectively leaving parts used in the circuit layers. A gate electrode 86 is disposed on the channel part of the TFT 72 with an interposition of a gate insulating film 84. The gate insulating film 84 is typically formed of TEOS. The gate electrode 86 is formed by, for example, patterning a metal film formed by sputtering or the like. On the gate electrode 86, an interlayer insulating layer 88 is disposed so as to cover the gate electrode 86. The interlayer insulating layer 88 is formed of, for example, the inorganic insulating material as above. Into the semiconductor region 82 (p-Si) to be the source/drain parts of the TFT 72, impurities are introduced by an ion injection, and further a source electrode 90a and a drain electrode 90b electrically connected thereto are formed, to constitute the TFT 72.

On the TFT 72, an interlayer insulating film 92 is disposed. On the surface of the interlayer insulating film 92, a wiring 94 is disposed. The wiring 94 is formed by, for example, patterning a metal film formed by sputtering or the like. With the metal film that forms the wiring 94, and the metal film used for forming the gate electrode 86, the source electrode 90a, and the drain electrode 90b, for example, the wiring 116, and the scan signal line 28, the image signal line 30, and the driving power supply line 32 that are illustrated in FIG. 1 can be formed in a multilayer wiring structure. On the wiring 94, for example, a planarizing film 96 is formed of a resin material such as acrylic resin, and in the display region 42, the OLED 6 is formed on the planarizing film 96.

The OLED 6 includes a lower electrode 100, an organic material layer 102, and an upper electrode 104. The organic material layer 102 includes, specifically, a hole transporting layer, a light emitting layer, an electron transporting layer, and the like. The OLED 6 is typically formed by laminating the lower electrode 100, the organic material layer 102, and the upper electrode 104 in this order from the base material 70 side. In the present embodiment, the lower electrode 100 is the anode of the OLED 6, and the upper electrode 104 is the cathode.

If the TFT 72 illustrated in FIG. 3 is the driving TFT 12 having an n-channel, the lower electrode 100 is connected to the source electrode 90a of the TFT 72. Specifically, after forming the planarizing film 96 described above, a contact hole 110 for connecting the lower electrode 100 to the TFT 72 is formed, and for example by patterning the surface of the planarizing film 96 and a conductive body part formed in the contact hole 110, the lower electrode 100 connected to the TFT 72 is formed for each pixel.

On the above structure, a bank 112 that separates the pixels is disposed. For example, after forming the lower electrode 100, the bank 112 is formed at a boundary of the pixels, and on an effective region (the region where the lower electrode 100 is not covered) of the pixel surrounded by the bank 112, the organic material layer 102 and the upper electrode 104 are laminated. The upper electrode 104 is formed of, for example, a transparent electrode material such as ITO and IZO, and a translucent metal material such as MgAg.

On the upper electrode 104, the sealing layer 106 is disposed. The sealing layer 106 is formed by, for example, forming an $SiN_y$ film by the chemical vapor deposition (CVD) method. The sealing layer 106 may be formed also by laminating a plurality of layers, and an organic film may be laminated on the $SiN_y$ film. Further, for example, in order to secure a mechanical strength of the surface of the display panel 40, a protective film 114 is arranged on the surface of the display region 42. Meanwhile, on the component mounting region 46, no protection film 114 is provided so that the IC and the FPC are easily connected with the component mounting region 46. A wiring of the FPC 50 and a terminal of the driver IC 48 are electrically connected to, for example, the wiring 116.

Figure 4:
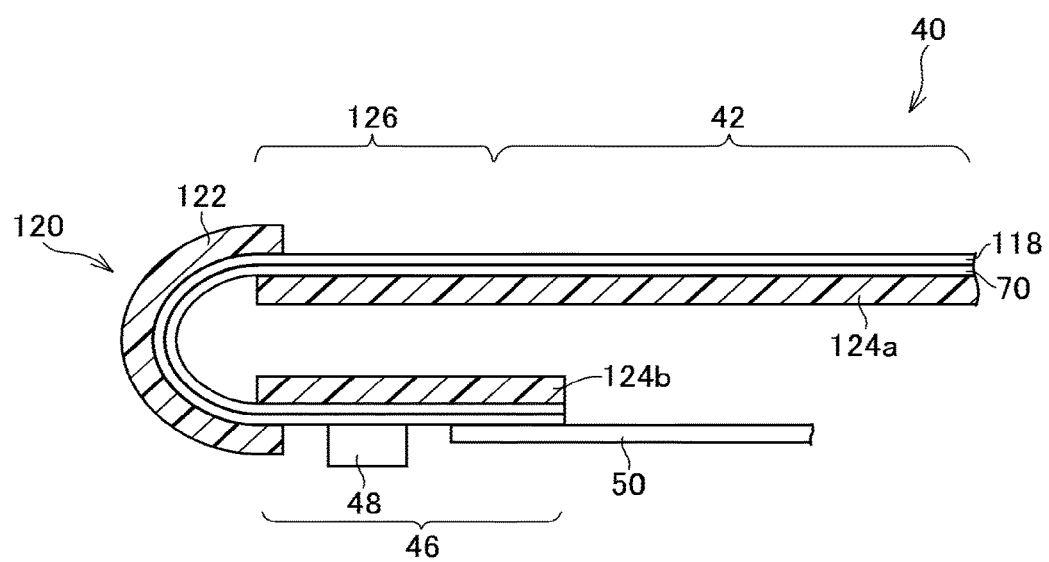
FIG. 4 is a diagram that illustrates an example of a state where the display panel illustrated in FIG. 2 is bent at its one edge.
Figure 5:
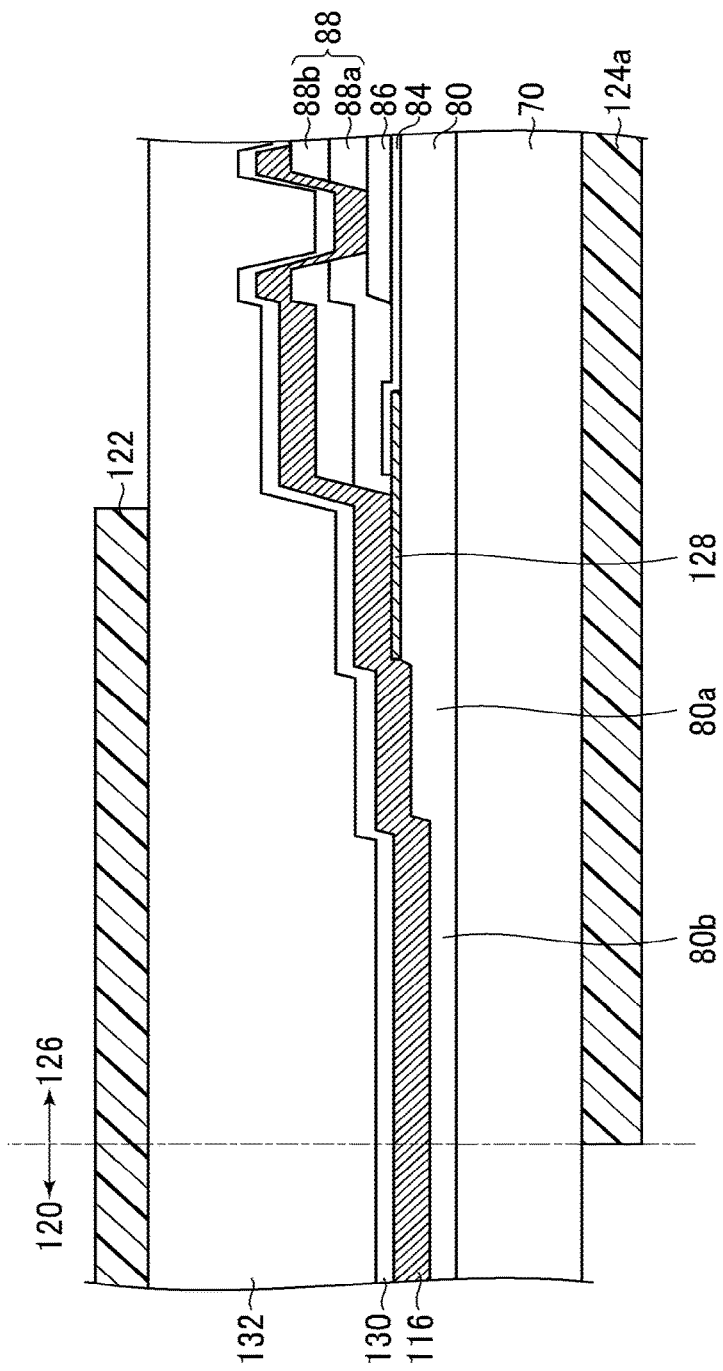
FIG. 5 is an enlarged cross sectional diagram that illustrates an example of a region near the bending region of the display panel illustrated in FIG. 2.
Figure 6:
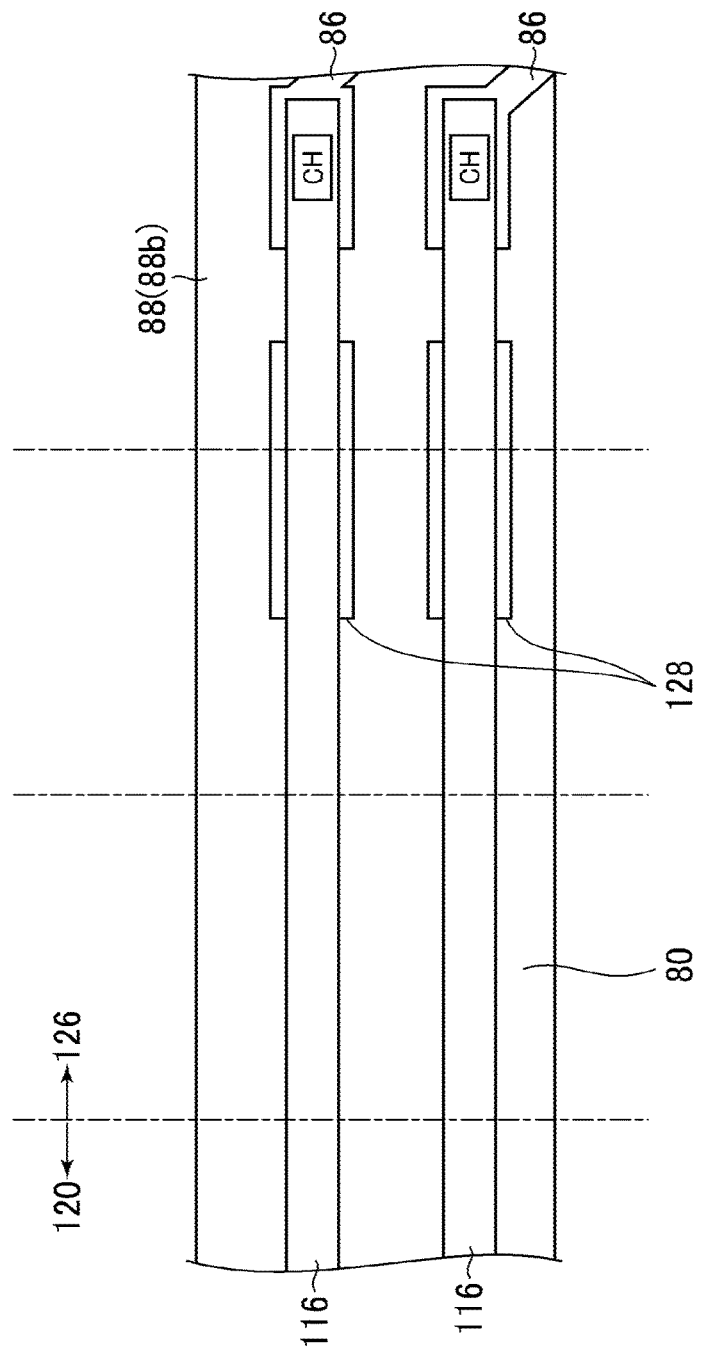
FIG. 6 is a planar diagram that illustrates an example of a region near the bending region of the display panel illustrated in FIG. 2.

FIG. 4 is a diagram that illustrates an example of a condition where one edge of the display panel illustrated in FIG. 2 is bent, and illustrates cross section illustrated in FIG. 2. FIG. 5 is an enlarged cross sectional diagram that illustrates an example of a region near the bending region of the display panel illustrated in FIG. 2. FIG. 6 is a planar diagram that illustrates an example of a region near the bending region of the display panel illustrated in FIG. 2. The display panel 40 can be manufactured with the base material 70 kept in a planar form as illustrated in FIG. 3, but for example, when it is placed in the housing of the organic EL display device 2, as illustrated in FIG. 4, a bending region 120 is provided outside the display region 42 to arrange the component mounting region 46 behind the display region 42. Note that in FIG. 4, the lamination structure on the base material 70 out of the lamination structure of the display panel 40 illustrated in FIGS. 3 and 5 is illustrated in a simplified manner as an upper structure layer 118. Further, in FIG. 6, the members illustrated as being positioned over the wiring 116 in FIG. 5 are not illustrated.

As illustrated in FIG. 4, on the upper structure layer 118 side of the display panel 40, a resin layer 122 is provided so as to cover all of the bending region 120, and the bending region 120 is reinforced. Further, on the base material 70 side of the display panel 40 reinforcement materials 124a and 124b constituted, for example, by an adhesive film are respectively provided on the both sides of the bending region 120.

As illustrated in FIG. 5, in a frame region 126 between the display region 42 and the bending region 120 a level difference moderating layer 128 is disposed on the underlayer so as to extend toward the bending region 120 side from the edge part of the interlayer insulating film 88, and moderates a level difference between the interlayer insulating layer 88 and the underlayer 80. Specifically, by disposing the level difference moderating layer 128 to form a shape of step, the level difference between the interlayer insulating layer 88 and the underlayer 80 is moderated. Note that there is a case where a region that is located outside the display region 42 and is adjacent to the display region 42 is called a peripheral region. The bending region 120 and the frame region 126 are included in the peripheral region. Although in the illustrated example, the interlayer insulating layer 88 includes a first interlayer insulating layer 88a and a second interlayer insulating layer 88b (for example, as a lamination structure where the $SiO_x$ layer and the $SiN_y$ layer are laminated from the base material 70 side), it may be constituted as a single layered structure. Further, in a region bounded by the level difference moderating layer 128, the thickness of the underlayer 80 gets thinner. As illustrated in FIG. 6, the level difference moderating layer 128 is formed along the wiring 116, and the wiring 116 is disposed on the interlayer insulating layer 88 and the level difference moderating layer 128. On the wiring 116, for example, a passivation film 130 formed of an inorganic insulating material such as $SiN_y$ is disposed. Further, on the passivation film 130, a planarizing layer 132 is disposed. The planarizing layer 132 is formed of, for example, a resin material such as acrylic resin. In the bending region 120, a layer formed of an inorganic insulating material (e.g., the underlayer 80, the interlayer insulating layer 88, and the passivation film 130) is preferably omitted or made to be thin, since a layer formed of an inorganic insulating material tends to break easily by being bent. Whereas, there is a fear that a level difference is generated along with such omitting or thinning, and a severance of the wiring 116 (e.g., a severance that occurs when laminating the wiring 116) occurs due to this level difference. As described above, by disposing the level difference moderating layer 128, an occurrence of such severance can be suppressed.

In the illustrated example, the gate insulating film 84 is disposed so that its edge covers a part of the level difference moderating layer 128, and the interlayer insulating layer 88 is disposed so as to cover the gate insulating film 84. The level difference moderating layer 128 is formed by, for example, providing a film for forming the level difference moderating layer on the base material 70 (the underlayer 80), and patterning this film for forming the level difference moderating layer. As a formation material of the level difference moderating layer 128, for example, a semiconductor material such as polysilicon (p-Si) and oxide semiconductor (e.g., TAOS), and metal are used. In one embodiment, as a formation material of the level difference moderating layer 128, a material is used which is etched more hardly than an inorganic insulating material is etched at an etching to be described later. The level difference moderating layer 128 is formed, for example, when the TFT (e.g., the semiconductor region 82) is formed in the display region 42, taking the manufacturing efficiency and the like into account.

The interlayer insulating layer 88 is formed by, for example, patterning, by etching, the inorganic insulating material film formed by the CVD method or the like on the base material 70 (the underlayer 80) with an interposition of the gate insulating film 84. At the time of this etching, the underlayer 80 is etched also, and a thin part 80*a* that has a small thickness is formed in a region bounded by the level difference moderating layer 128 that is hardly etched. In the illustrated example, the underlayer 80 is subjected to one more step of etching, and thus a thin part 80*b* having a still smaller thickness is formed. Like this, in the bending region 120, the interlayer insulating layer 88 is not provided, and the underlayer 80 is thinner than that in the display region 42. Note that in the illustrated example, the passivation film 130 is disposed on the wiring 116 also in the bending region 120, but for example, in order to prevent a break due to bending, it may be configured that the end of the passivation film 130 is set to be inside the frame region 126, and the passivation film 130 is not provided in the bending region 120.

In the bending region 120, as a configuration of a resin material layer disposed on the side of the wiring 116 (the passivation film 130) opposite to the side on which the base material 70 is disposed, any appropriate configuration can be adopted. In the illustrated example, the planarizing layer 132 is disposed on the wiring 116 with an interposition of the passivation film 130, and the resin layer 122 is provided on the planarizing layer 132. Whereas, the planarizing layer 132 may be formed all over the bending region 120, and may be formed only on a part corresponding to the wiring 116. Further, the planarizing layer 132 may be omitted and the resin layer 122 is provided directly on the wiring 116 (the passivation film 130).

The present invention is not limited to the above embodiments, and various kinds of variations are accepted. For example, the configurations described in the above embodiments can be replaced with substantially the same configurations, configurations that exhibit the same functional effects, or configurations capable of achieving the same object. For example, as illustrated in FIG. 7, on the first interlayer insulating layer 88*a*, the level difference moderating layer 128 may be formed so as to extend from the edge of the second interlayer insulating layer 88*b* toward the bending region side, to moderate the level difference between the interlayer insulating layer 88 and the underlayer 80. Further, it may be configured that after disposing a first level difference moderating layer on the underlayer 80 as illustrated in FIG. 5, a second level difference moderating layer is disposed on the first interlayer insulating layer 88*a* as illustrated in FIG. 7.

It is understood that without departing from the spirit of the present invention, those skilled in the art can arrive at various kinds of variations and modifications, and such variations and modifications belong to the scope of the present invention. For example, each of the above embodiments to which addition, deletion, or design change of components, or addition, omission, or condition change of processes is suitably applied by those skilled in the art are also encompassed within the scope of the present invention as long as they fall within the spirit of the present invention.

What is claimed is:

1. A display device comprising:
    a base material including a display region, and a peripheral region which is located outside the display region, at least a part of the peripheral region being a bending region;
    an insulating layer that is disposed on the base material, extends from the display region to a part of the peripheral region, and is located apart from an edge of the base material;
    at least one level difference moderating layer that is disposed under the insulating layer and extends from an edge of the insulating layer toward a side of the bending region; and
    at least one wiring disposed on the insulating layer and the at least one level difference moderating layer.

2. The display device according to claim 1, wherein the at least one level difference moderating layer is disposed along the at least one wiring.

3. The display device according to claim 1, wherein the at least one level difference moderating layer comprises a semiconductor material and/or metal.

4. The display device according to claim 1, wherein the insulating layer comprises an inorganic insulating material.

5. The display device according to claim 1, further comprising: an underlayer that comprises an inorganic insulating material and is disposed on the base material, under the insulating layer, and under the at least one level difference moderating layer.

6. The display device according to claim 5, wherein the underlayer has a first portion with a first thickness and a second portion with a second thickness,
    the first portion overlaps the at least one level difference moderating layer and contacts the second portion directly,
    the second portion does not overlap the at least one level difference moderating layer, and
    the second thickness is smaller than the first thickness.

7. The display device according to claim 1,
    wherein the insulating layer has a lamination structure including a first insulating layer and a second insulating layer, and the at least one level difference moderating layer extends from an edge (edges) of the first insulating layer and/or the second insulating layer toward a side of the bending region.

8. The display device according to claim 1,
wherein the at least one wiring comprises a plurality of wirings, the plurality of wirings being separated from one another,
the at least one level difference moderating layer comprises a plurality of level difference moderating layers, the plurality of level difference moderating layers being separated from one another, and
each of the plurality of level difference moderating layers is positioned under each of the plurality of wirings.

9. A manufacturing method of a display device comprising:
forming a level difference moderating layer on a portion of a base material including a display region and a peripheral region which is located outside the display region, at least a part of the peripheral region being a bending region, and the portion being included in the peripheral region and being separated from the display region;
forming an insulating layer covering the level difference moderating layer;
patterning the insulating layer by etching, and forming a patterned insulating layer which covers only an edge part of the level difference moderating layer, the edge part being located at side of the display region; and
forming a wiring on the patterned insulating layer and the level difference moderating layer,
wherein the level difference moderating layer is formed of a material an etching rate of which is lower than that of the insulating layer.

10. The manufacturing method of a display device according to claim 9, wherein an underlayer is formed on the base material in advance before forming the level difference moderating layer, and when performing the etching the underlayer is also etched.

\* \* \* \* \*